United States Patent
Dai et al.

(10) Patent No.: US 11,366,537 B2
(45) Date of Patent: Jun. 21, 2022

(54) SUBSTRATE INCLUDING TOUCH STRUCTURE LAYER, MANUFACTURING METHOD THEREOF AND DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Ming Dai, Beijing (CN); Jongkyun Lee, Beijing (CN); Hongcan Liu, Beijing (CN); Xin Cao, Beijing (CN); Zhu Chen, Beijing (CN); Haoyuan Fan, Beijing (CN); Kwiyoung Yun, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/942,154

(22) Filed: Jul. 29, 2020

(65) Prior Publication Data
US 2021/0048908 A1 Feb. 18, 2021

(30) Foreign Application Priority Data
Aug. 16, 2019 (CN) .......................... 201910759083.5

(51) Int. Cl.
*G06F 3/041* (2006.01)
*G06F 3/044* (2006.01)
*G02F 1/1333* (2006.01)
*G02F 1/1335* (2006.01)
*H01L 27/32* (2006.01)
*H01L 51/56* (2006.01)

(52) U.S. Cl.
CPC ........ *G06F 3/0412* (2013.01); *G02F 1/13338* (2013.01); *G02F 1/133512* (2013.01); *G02F 1/133514* (2013.01); *G06F 3/0448* (2019.05); *H01L 27/322* (2013.01); *H01L 27/323* (2013.01); *H01L 51/56* (2013.01); *G06F 2203/04103* (2013.01)

(58) Field of Classification Search
CPC ........... G02F 1/13338; G02F 1/133512; G02F 1/133514; G06F 2203/04103; G06F 3/0412; G06F 3/0448; H01L 27/322; H01L 27/323; H01L 51/56
See application file for complete search history.

(56) References Cited

U.S. PATENT DOCUMENTS

| | | | |
|---|---|---|---|
| 2016/0116779 A1* | 4/2016 | Yeh | G02F 1/133345 349/12 |
| 2016/0132154 A1* | 5/2016 | Lee | G06F 3/0443 345/174 |
| 2016/0132155 A1* | 5/2016 | Lee | G06F 3/0412 345/174 |

(Continued)

Primary Examiner — Chun-Nan Lin

(57) ABSTRACT

A substrate, and the substrate includes a base and a touch structure layer are provided. The substrate includes a base and a touch structure layer, the touch structure layer is disposed on the base and includes a first electrode layer, a color filter layer and a second electrode layer laminated on the base, and the color filter layer is disposed between the first electrode layer and the second electrode layer.

18 Claims, 8 Drawing Sheets

(56) References Cited

U.S. PATENT DOCUMENTS

| | | | | |
|---|---|---|---|---|
| 2018/0342560 A1* | 11/2018 | Ma | ............... | G06F 3/0445 |
| 2018/0348958 A1* | 12/2018 | Lee | ............... | G06F 3/0421 |
| 2019/0129215 A1* | 5/2019 | Tang | ............... | H01L 27/124 |
| 2019/0212594 A1* | 7/2019 | Chen | ............... | G02F 1/1368 |
| 2020/0355956 A1* | 11/2020 | Chang | ............... | G02F 1/136286 |
| 2020/0393722 A1* | 12/2020 | Cho | ............... | G02F 1/133512 |

* cited by examiner

SUBSTRATE INCLUDING TOUCH STRUCTURE LAYER, MANUFACTURING METHOD THEREOF AND DISPLAY DEVICE

TECHNICAL FIELD

At least one embodiment of the present disclosure relates to a substrate, a manufacturing method thereof and a display device.

BACKGROUND

Electronic display products with touch function are increasingly favored by consumers. The current common technology includes resistive type, capacitive type, optical type and the like, wherein a capacitive type touch pad has become the mainstream touch technology currently used in mid-to-high-end consumer electronic products due to the characteristics of high accuracy, multi-point-touch, high durability and high touch resolution.

However, the structure of the current substrate with a touch structure is relatively complicated, which limits the light and thin design of the substrate, and the manufacturing process is complicated. In addition, a distance between the touch structure and a touch object (such as a finger) is large, so the touch sensitivity is low.

SUMMARY

At least one embodiment of the present disclosure provides a substrate, and the substrate includes a base and a touch structure layer, the touch structure layer is disposed on the base and includes a first electrode layer, a color filter layer and a second electrode layer laminated to each other, and the color filter layer is disposed between the first electrode layer and the second electrode layer.

For example, in the substrate provided by at least one embodiment of the present disclosure, one of the first electrode layer and the second electrode layer includes a plurality of first strip-shaped electrodes arranged side by side, the other one of the first electrode layer and the second electrode layer includes a plurality of second strip-shaped electrodes arranged side by side; and the plurality of first strip-shaped electrodes and the plurality of second strip-shaped electrodes are intersected with each other.

For example, in the substrate provided by at least one embodiment of the present disclosure, the first electrode layer includes a plurality of first strip-shaped electrodes arranged side by side and a plurality of second strip-shaped electrodes arranged side by side, the plurality of first strip-shaped electrodes and the plurality of second strip-shaped electrodes are intersected with each other, and each of the plurality of first strip-shaped electrodes is disconnected at intersections with the plurality of second strip-shaped electrodes; the second electrode layer includes a plurality of connecting bridges, and portions of each of the plurality of first strip-shaped electrodes that are disconnected at the intersections with the plurality of second strip-shaped electrodes are connected with each other through the connecting bridge.

For example, in the substrate provided by at least one embodiment of the present disclosure, a through hole is formed in the color filter layer, and each of the plurality of connecting bridge is connected with the first strip-shaped electrode through the through hole.

For example, in the substrate provided by at least one embodiment of the present disclosure, the second electrode layer is disposed between the base and the color filter layer.

For example, in the substrate provided by at least one embodiment of the present disclosure, the base includes a display array layer, the display array layer includes a plurality of light-emitting elements, the color filter layer includes a plurality of color filters, and the plurality of color filters include at least two colors and are in one-to-one correspondence with the plurality of light-emitting elements.

For example, the substrate provided by at least one embodiment of the present disclosure further comprise a black matrix, the color filter layer includes a plurality of color filters, and the black matrix is disposed between the plurality of color filters.

For example, in the substrate provided by at least one embodiment of the present disclosure, the touch structure layer includes a plurality of sub-touch regions, and a portion of at least one of the first electrode layer and the second electrode layer disposed in the plurality of sub-touch regions is set to be a latticed electrode.

For example, in the substrate provided by at least one embodiment of the present disclosure, the latticed electrode includes a plurality of electrode strips, the plurality of electrode strips are intersected with each other to form a plurality of openings in one-to-one correspondence with the light-emitting elements; and an orthographic projection of each of the plurality of electrode strips on a plane in which the base is located is outside an orthographic projection of the light-emitting element on the plane in which the base is located.

For example, the substrate provided by at least one embodiment of the present disclosure further comprise a black matrix, the black matrix is configured to make contact with a surface of each of the plurality of electrode strips of one of the latticed electrodes, away from the base, and an orthographic projection of the black matrix on the plane in which the base is located is outside an orthographic projection of the light-emitting element on the plane in which the base is located.

For example, in the substrate provided by at least one embodiment of the present disclosure, the black matrix is disposed on the surface of each of the plurality of electrode strips of one of the latticed electrodes, away from the base, and on side surfaces connected with the surface; and the latticed electrodes are opaque electrodes.

For example, in the substrate provided by at least one embodiment of the present disclosure, two side surfaces of the black matrix are aligned with side surfaces of the electrode strip contacting the black matrix.

For example, in the substrate provided by at least one embodiment of the present disclosure, a projection of the black matrix corresponds to a junction between the color filters and is overlapped with projections of two adjacent color filters.

At least one embodiment of the present disclosure provides a display device, the display device includes the substrate as mentioned above.

At least one embodiment of the present disclosure provides a method for manufacturing a substrate, the method comprises providing a base and forming a touch structure layer, the forming a touch structure layer includes forming the touch structure layer on the base, the touch structure layer includes a laminated layer of a first electrode layer, a color filter layer and a second electrode layer, and the color filter layer is formed between the first electrode layer and the second electrode layer.

For example, in the method for manufacturing a substrate provided by at least one embodiment of the present disclosure, the forming the touch structure layer includes: depositing a first conductive material film on the base, performing a patterning process on the first conductive material film to form the first electrode layer including a plurality of first strip-shaped electrodes arranged side by side; depositing an insulating material that covers the first electrode layer on the first electrode layer to form the color filter layer; and depositing a second conductive material film on the base, performing a patterning process on the second conductive material film to form the second electrode layer including a plurality of second strip-shaped electrodes arranged side by side, and the plurality of first strip-shaped electrodes and the plurality of second strip-shaped electrodes are intersected with each other.

For example, in the method for manufacturing a substrate provided by at least one embodiment of the present disclosure, the forming the touch structure layer includes: depositing a second conductive material film on the base, performing a patterning process on the second conductive material film to form the second electrode layer including a plurality of connecting bridges; depositing an insulating material that covers the second electrode layer on the second electrode layer to form the color filter layer, and performing a patterning process on the color filter layer to form a plurality of openings exposing a portion of the connecting bridge; and depositing a first conductive material film on the base, performing a patterning process on the first conductive material film to form the first electrode layer including a plurality of first strip-shaped electrodes arranged side by side and a plurality of second strip-shaped electrodes arranged side by side, wherein the plurality of first strip-shaped electrodes and the plurality of second strip-shaped electrodes are intersected with each other, each of the plurality of first strip-shaped electrodes is disconnected at intersections with the second strip-shaped electrodes; and portions of each of the plurality of first strip-shaped electrodes that are disconnected at the intersections with the second strip-shaped electrodes are connected with each other through the connecting bridge.

For example, in the method for manufacturing a substrate provided by at least one embodiment of the present disclosure, the color filter layer is formed to include a plurality of color filters of at least two colors, and the base is formed to include a display array layer including a plurality of light-emitting elements, and the forming the touch structure layer also includes: performing a patterning process on at least one of the first conductive layer and the second conductive layer, so that at least one of the first conductive layer and the second conductive layer is formed to be a latticed electrode, the latticed electrode includes a plurality of electrode strips, the plurality of electrode strips are intersected with each other to form a plurality of openings; an orthographic projection of each of the plurality of openings on the plane in which the base is located coincides with an orthographic projection of the light-emitting element on the plane in which the base is located, and orthographic projections of the plurality of electrode strips on the plane in which the base is located are located within orthographic projections of gaps of the light-emitting elements on the plane in which the base is located.

For example, the method for manufacturing a substrate provided by at least one embodiment of the present disclosure further comprises forming a black matrix on a surface of the touch structure layer away from the base, and an orthographic projection of the black matrix on the plane in which the base is located is located within the orthographic projections of the gaps of the light-emitting elements on the plane in which the base is located.

For example, in the method for manufacturing a substrate provided by at least one embodiment of the present disclosure, the black matrix is disposed on a surface of each of the plurality of electrode strips of one of the latticed electrodes, away from the base, and on side surfaces connected with the surface; and the latticed electrodes are opaque electrodes.

BRIEF DESCRIPTION OF THE DRAWINGS

In order to clearly illustrate the technical solutions of the embodiments of the present invention, the drawings of the embodiments will be briefly described in the following. It is obvious that the described drawings are only related to some embodiments of the invention and thus are not limitative of the present invention.

REFERENCE NUMBERS

Figure 1:
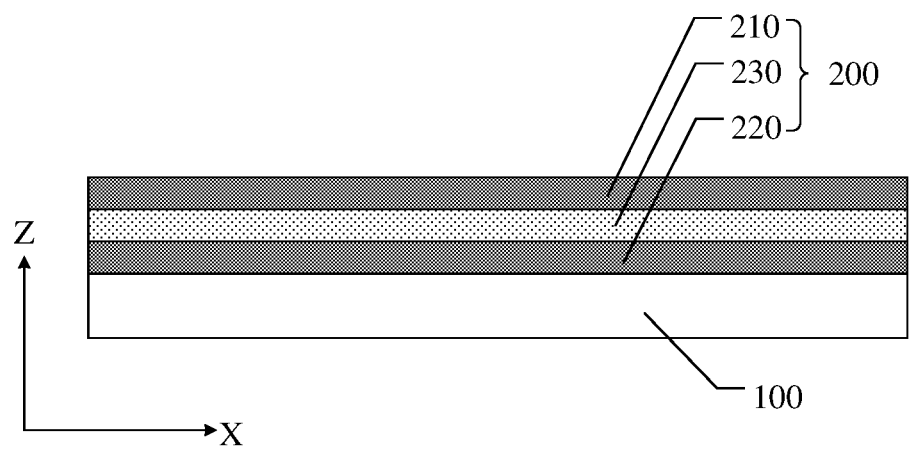
FIG. 1 is a cross-sectional view of a substrate provided by some embodiments of the present disclosure.

10—first strip-shaped electrode; 11—electrode strip; 20—second strip-shaped electrode; 30—connecting bridge; 40—through hole; 100—base; 110—display array layer; 111—light-emitting element; 112—pixel definition layer; 120—driving circuit layer; 130—encapsulation layer; 200—touch structure layer; 210—first electrode layer; 220—second electrode layer; 230—color filter layer; 300—black matrix; 400—cover plate; 500—optically clear adhesive layer.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a current substrate with display function, a color filter layer is usually arranged to reduce the interference caused by the reflection of external light, thereby improving the definition of an image. For example, a touch structure is disposed on the substrate so as to have touch function. Thus, the design thickness of the substrate is large, and the structure and the manufacturing process are complicated. In addition, the color filter layer is usually disposed on a side of the touch structure for touch, so a distance between the touch structure and a touch object (such as a finger) is increased, thereby reducing the touch sensitivity.

At least one embodiment of the present disclosure provides a substrate, which comprises a base and a touch structure layer disposed on the base. The touch structure layer includes a first electrode layer, a color filter layer and a second electrode layer which are stacked on the base. The color filter layer is disposed between the first electrode layer and the second electrode layer. For instance, the color filter layer is an insulating layer. The color filter layer is disposed in the touch structure layer and acts as an insulating layer among the first electrode layer, the color filter layer and the second electrode layer, so no color filter layer is required to be additionally arranged outside the touch structure layer, thereby simplifying the structure of the substrate, simplifying the manufacturing process of the substrate, being favorable for the light and thin design of the substrate, and improving the touch sensitivity of the substrate.

Description will be given below to the substrate, the manufacturing method thereof and the display device provided by at least one embodiment of the present disclosure with reference to the accompanying drawings. The positions of components in the substrate are described in the accompanying drawings by establishing a spatial rectangular coordinate system by taking a base of the substrate as a reference. In the spatial rectangular coordinate system, X axis and Y axis are parallel to a plane in which the base is located, and Z axis is perpendicular to the plane in which the base is located.

As shown in FIG. 1, the substrate provided by at least one embodiment of the present disclosure comprises a base 100 and touch structure layers 200 which are sequentially superimposed on the base 100. The touch structure layer 200 includes a second electrode layer 220, a color filter layer 230 and a first electrode layer 210 which are superimposed to each other.

It should be noted that in the embodiment of the present disclosure, the specific structure of the touch structure layer is not limited, as long as the color filter layer is disposed between two electrode layers of the touch structure layer, and the structure of the touch structure layer may be designed according to actual demands. Description will be given below to several structures of the touch structure layer in some embodiments.

Figure 2A:
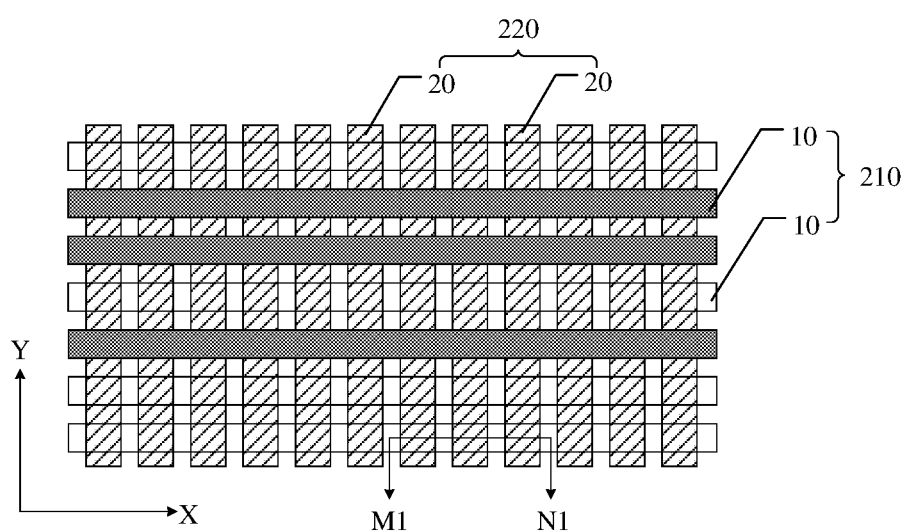
FIG. 2A is a plan view of partial structure of a substrate provided by some embodiments of the present disclosure.
Figure 2B:
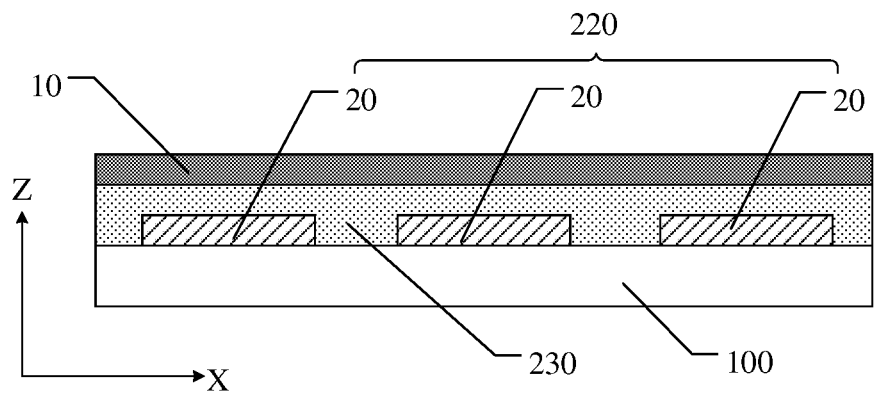
FIG. 2B is a cross-sectional view of the substrate as shown in FIG. 2A along M1-N1.

For instance, in the substrate provided by some embodiments of the present disclosure, one of the first electrode layer and the second electrode layer includes a plurality of first strip-shaped electrodes arranged side by side; the other one of the first electrode layer and the second electrode layer includes a plurality of second strip-shaped electrodes arranged side by side; and the first strip-shaped electrode and the second strip-shaped electrode are intersected with each other. Illustratively, as shown in FIGS. 2A and 2B, the first electrode layer 210 includes a plurality of first strip-shaped electrodes 10 which are extended along the X-axis direction; the plurality of first strip-shaped electrodes 10 are arranged to be spaced apart from each other along the Y-axis direction; the second electrode layer 220 includes a plurality of second strip-shaped electrodes 20 which are extended along the Y-axis direction; and the plurality of second strip-shaped electrodes 20 are arranged to be spaced apart from each other along the X-axis direction. Thus, the plurality of first strip-shaped electrodes 10 and the plurality of second strip-shaped electrodes 20 are arranged in different layers and intersected with each other. The color filter layer 230 is disposed between the first electrode layer 210 and the second electrode layer 220, so that the first strip-shaped electrodes 10 and the second strip-shaped electrodes 20 are spaced from each other. For instance, one of the first strip-shaped electrode 10 and the second strip-shaped electrode 20 is a driving electrode, and the other one of the first strip-shaped electrode 10 and the second strip-shaped electrode 20 is a sensing electrode.

It should be noted that in the embodiment of the present disclosure, when the first electrode layer includes the plurality of first strip-shaped electrodes arranged side by side and the second electrode layer includes the plurality of second strip-shaped electrodes arranged side by side, the second electrode layer, the color filter layer and the first electrode layer may be sequentially stacked on the base 100 as shown in FIGS. 2A and 2B, or the first electrode layer, the color filter layer and the second electrode layer are sequentially stacked on the base.

For instance, in the substrate provided by some other embodiments of the present disclosure, the first electrode layer includes a plurality of first strip-shaped electrodes arranged side by side and a plurality of second strip-shaped electrodes arranged side by side; the first strip-shaped electrodes and the second strip-shaped electrodes are intersected with each other; the first strip-shaped electrode is disconnected at an intersection with the second strip-shaped electrode; the second electrode layer includes a plurality of connecting bridges; and portions of the first strip-shaped electrode that is disconnected at the intersection with the second strip-shaped electrode are connected with each other through the connecting bridge.

Figure 3A:
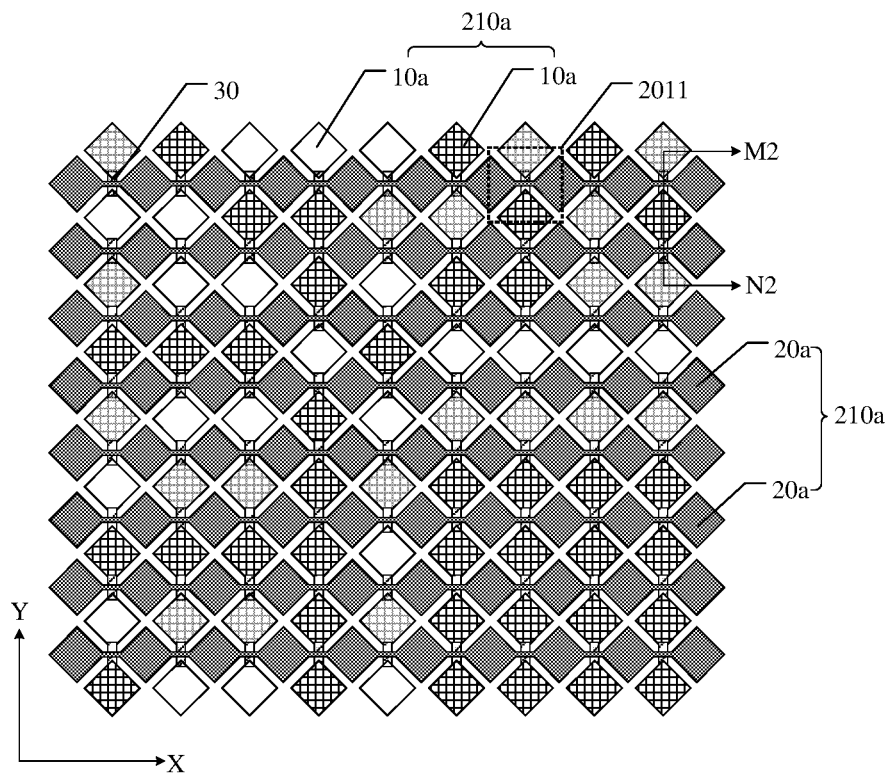
FIG. 3A is a plan view of partial structure of another substrate provided by some embodiments of the present disclosure.
Figure 3B:
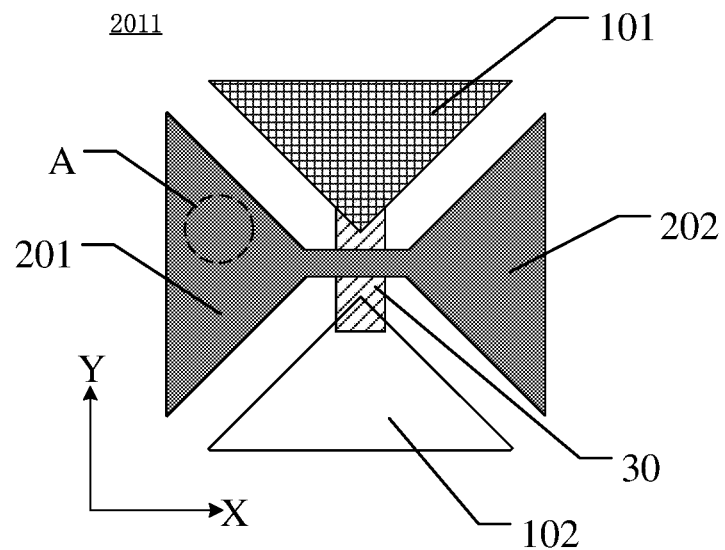
FIG. 3B is a plan view of one sub-touch region of the substrate as shown in FIG. 3A.
Figure 3C:
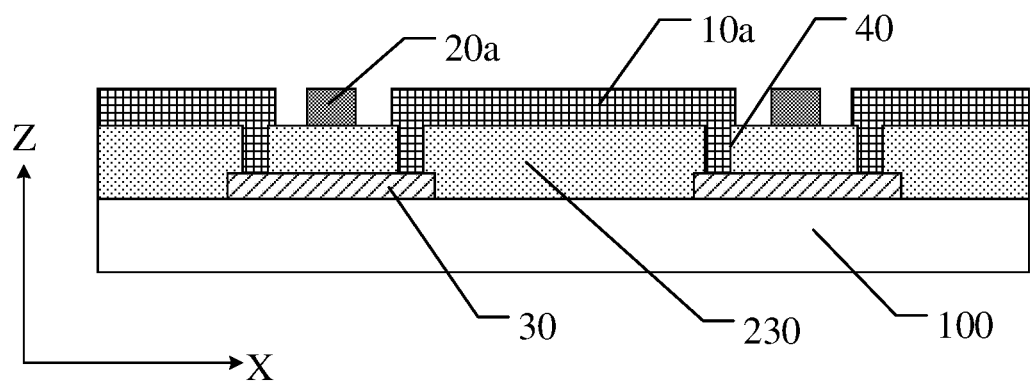
FIG. 3C is a cross-sectional view of the substrate as shown in FIG. 3A along M2-N2.

Illustratively, as shown in FIGS. 3A, 3B and 3C, a first electrode layer 210a includes a plurality of first strip-shaped electrodes 10a which are extended along the Y-axis direction and a plurality of second strip-shaped electrodes 20a which are extended along the X-axis direction; the plurality of first strip-shaped electrodes 10a are arranged to be spaced from each other along the X-axis direction; and the plurality of second strip-shaped electrodes 20a are arranged to be spaced from each other along the Y-axis direction. For instance, the first strip-shaped electrode 10a may include a plurality of electrode blocks that are connected with each other, e.g., diamond blocks as shown in FIG. 3B, and electrode strips that connect the electrode blocks; the second strip-shaped electrode 20a may also include a plurality of electrode blocks that are connected with each other, e.g., diamond blocks as shown in FIG. 3B, and electrode strips that connect the electrode blocks; and the electrode strip of one of the first strip-shaped electrode and the second strip-shaped electrode is the connecting bridge. Alternatively, the electrode block may also be in other shapes, so the overlap area of the first strip-shaped electrodes is greatly increased, and then the touch sensitivity is improved. Moreover, the same shape of each electrode block is also favorable for producing. Alternatively, the first strip-shaped electrode 10a may be a continuously arranged strip-shaped electrode; the second strip-shaped electrode 20a may include a plurality of segment electrodes which are disconnected at the first strip-shaped electrode; and different segment electrodes are connected with each other through the connecting bridge. No limitation will be given here in the embodiment of the present disclosure. Thus, the plurality of first strip-shaped electrodes 10a and the plurality of second strip-shaped electrodes 20a are arranged in the same layer and intersected with each other. At intersections of the first strip-shaped electrodes 10a and the second strip-shaped electrodes 20a, the first strip-shaped electrodes 10a are disconnected, and the second strip-shaped electrodes 20a are not disconnected. The second electrode layer 220a includes a plurality of connecting bridges 30. The connecting bridges 30 are arranged at the intersections of the first strip-shaped electrodes 10a and the second strip-shaped electrodes 20a to connect the disconnected portions of the first strip-shaped electrode 10a. For instance, as shown in FIG. 3A, the touch structure layer includes a plurality of sub-touch regions 2011. As shown in FIG. 3B, in each sub-touch region 2011, the first strip-shaped electrode 10a includes a first sub-electrode 101 and a second sub-electrode 102 which are disconnected from each other, and the second strip-shaped electrode 20a includes a third sub-electrode 201 and a fourth sub-electrode 202 which are connected with each other.

For instance, in at least one embodiment of the present disclosure, a planar shape of a sub-electrode (e.g., a first sub-electrode, namely an electrode block) of the first strip-shaped electrode and the second strip-shaped electrode may be quadrangle as shown in FIGS. 3A and 3B, e.g., rectangle or diamond, so as to increase the plane area of the first strip-shaped electrode and the second strip-shaped electrode, thereby improving the sensitivity of the touch structure layer. It should be noted that a portion of each sub-electrode is shown in FIG. 3B.

For instance, in the substrate provided by at least one embodiment of the present disclosure, when the first electrode layer includes the plurality of first strip-shaped electrodes arranged side by side and the plurality of second strip-shaped electrodes arranged side by side, a through hole is formed in the color filter layer, and the connecting bridge is connected with the first strip-shaped electrodes through the through hole. Illustratively, as shown in FIG. 3C, at an intersected region of the first strip-shaped electrode 10a and the second strip-shaped electrodes 20, a through hole 40 is formed in the color filter layer 230, and the first strip-shaped electrode 10a is connected with a connecting bridge 30 through the through hole 40. For instance, the first sub-electrode 101 and the second sub-electrode 102 in FIG. 3B are respectively connected with the connecting bridge 30 through different through holes 40.

Figure 3D:
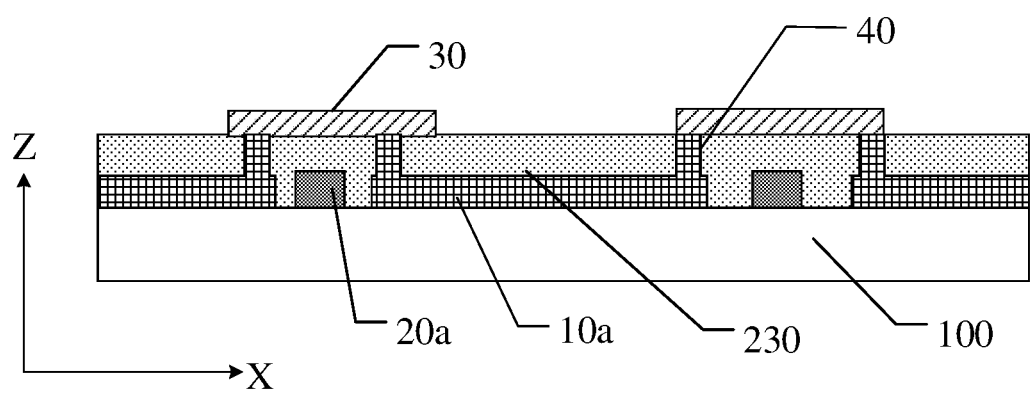
FIG. 3D is a cross-sectional view of an illustrative substrate provided by an embodiment of the present disclosure.

For instance, in the substrate provided by at least one embodiment of the present disclosure, when the first electrode layer includes the plurality of first strip-shaped electrodes arranged side by side and the plurality of second strip-shaped electrodes arranged side by side, the second electrode layer is disposed between the base and the color filter layer (as shown in FIG. 3C), or the first electrode layer is disposed between the base and the color filter layer (as shown in FIG. 3D).

For instance, in the substrate provided by at least one embodiment of the present disclosure, the color filter layer may be configured to include a planarized film layer, so as to provide a planarized surface, thereby improving the quality (planarization) of the first electrode layer or the second electrode layer formed on a surface of the color filter layer away from the base.

Description will be given below to the substrate, the manufacturing method thereof and the display device provided by at least one embodiment of the present disclosure by taking the touch electrode layer as shown in FIGS. 3A, 3B and 3C as an example.

For instance, in the substrate provided by some embodiments of the present disclosure, the first strip-shaped electrode, the second strip-shaped electrode and the connecting bridge may all be set to be planar electrodes. In this case, the materials of the first strip-shaped electrode, the second strip-shaped electrode and the connecting bridge may be transparent conductive materials. For instance, the transparent conductive materials may be indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotube or other transparent conductive materials. For instance, in at least one embodiment of the present disclosure, "transparent" may indicate that the light transmittance is 50%-100%, for example, moreover, 75%-100%.

Figure 4A:
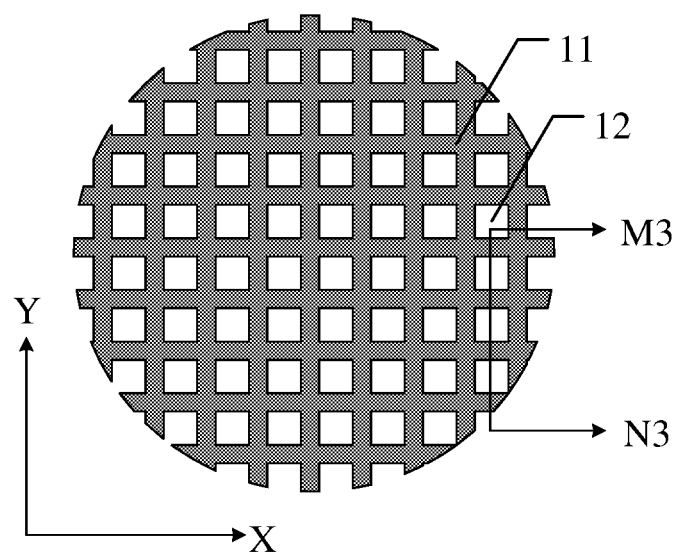
FIG. 4A is a plan view of partial structure of a substrate provided by some embodiments of the present disclosure.

For instance, in the substrate provided by some other embodiments of the present disclosure, the touch structure layer includes a plurality of sub-touch regions; and a portion of at least one of the first electrode layer and the second electrode layer, disposed in the sub-touch region, are set to be latticed, namely configured to be a latticed electrode. Illustratively, as shown in FIGS. 3B and 4A, a third sub-electrode 201 are set to be a latticed electrode. For instance, a first sub-electrode 101, a second sub-electrode 102 and a fourth sub-electrode 202 are also set to be latticed electrodes. For instance, the connecting bridge 30 may also be set to be a latticed electrode. The latticed electrode has less reflection of external light, thereby reducing the reflection of external light by the touch structure layer and improving the contrast of a display image.

For instance, mesh-holes (openings described below) of the latticed electrode may allow the display image to penetrate through, so the latticed electrode may be a transparent electrode and may also be an opaque electrode. For instance, a material of the opaque electrode may be metal such as silver, aluminum and copper. For instance, the opaque electrode may be an electrode formed by a plurality of film layers, e.g., a three-layer structure such as chromium-aluminum-chromium and titanium-aluminum-titanium, so as to have high intensity. In addition, in the case that the substrate is applied in the flexible field, the latticed electrode has little stress during bending and is not easy to break during bending. Moreover, the latticed electrode is set to be a multi-layer structure (such as the above three layers), so as to improve the bending ability and be conducive to the flexible design of the substrate.

Description will be given below to the substrate, the manufacturing method thereof and the display device provided by at least one embodiment of the present disclosure by taking the case that the first strip-shaped electrode, the second strip-shaped electrode and the connecting bridge are all set to be latticed electrodes as an example.

For instance, the substrate may be a touch substrate, or an array substrate or an opposing substrate having touch function, or a display substrate having touch function.

For instance, the substrate may be an opposing substrate of a liquid crystal display (LCD), in which the opposing substrate has touch function, or may be an opposing substrate of an organic light-emitting diode (OLED) display. No limitation will be given here in the embodiment of the present disclosure.

For instance, in the substrate provided by at least one embodiment of the present disclosure, the base may include a display array layer, and the display array layer includes a plurality of light-emitting elements. Illustratively, as shown in FIG. 4B, the base includes a bottom plate 140 and a display array layer 110 disposed on the bottom plate 140; the display array layer 110 includes a plurality of light-emitting elements 111; and the light-emitting elements 111 correspond to subpixels of the substrate.

For instance, in the substrate provided by at least one embodiment of the present disclosure, the base may include a display array layer; the display array layer includes a plurality of liquid crystal units; and the liquid crystal units correspond to subpixels of the substrate.

For instance, in the substrate provided by at least one embodiment of the present disclosure, the light-emitting element may be an organic light-emitting diode or a quantum dot light-emitting diode (QLED), and may include an anode, a cathode and a light-emitting functional layer disposed between the anode and the cathode. For instance, the light-emitting functional layers of the plurality of light-emitting elements are set to be able to emit light of different colors, e.g., red light, green light, blue light, yellow light, white light, etc. For instance, the light-emitting functional layers of the plurality of light-emitting elements are set to be integrated as one-body to emit light of the same color, e.g., white light, blue light, yellow light or light of other colors.

Figure 4B:
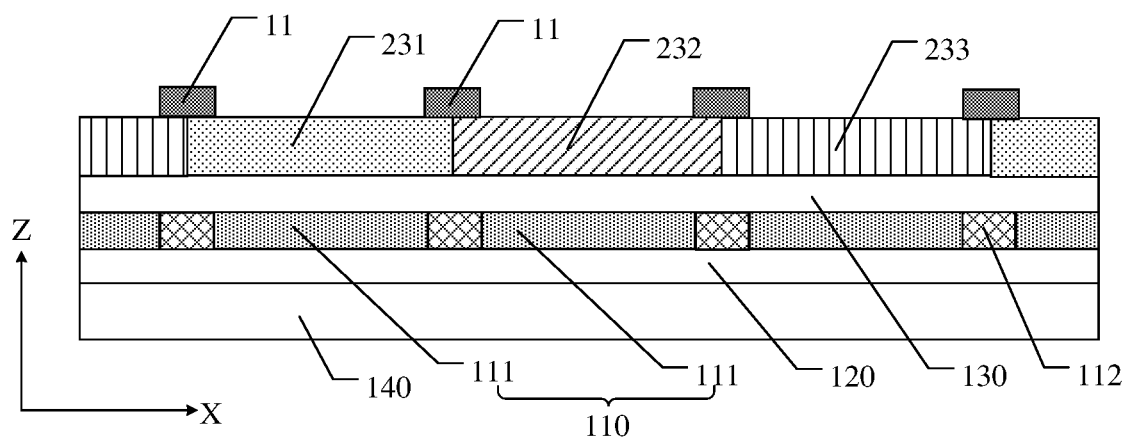
FIG. 4B is a cross-sectional view of the substrate as shown in FIG. 4A along M3-N3.

For instance, in at least one embodiment of the present disclosure, as shown in FIG. 4B, a display array layer 110 includes a pixel definition layer 112; and a light-emitting element 111 is disposed in an opening of the pixel definition layer 112, that is, the pixel definition layer 112 is disposed at a gap of the light-emitting elements 111.

For instance, in the substrate provided by at least one embodiment of the present disclosure, the latticed electrode includes a plurality of electrode strips; the plurality of electrode strips are intersected with each other to form a plurality of openings in one-to-one correspondence with the light-emitting elements; an orthographic projection of the opening on a plane in which the base is located coincides with an orthographic projection of a corresponding light-emitting element on the plane in which the base is located; and an orthographic projection of the electrode strip on the plane in which the base is located fall within an orthographic projection of the gap of the light-emitting elements on the plane in which the base is located. Thus, the latticed electrode will not block the light emitted by the light-emitting element, so the substrate can achieve normal display. For instance, in the case that the latticed electrode (the electrode strip) is an opaque electrode, the substrate can still achieve normal display. Illustratively, as shown in FIGS. 4A and 4B, an orthographic projection of an electrode strip 11 of the latticed electrode included in the display array layer on the base (the bottom plate 140 therein) is within an orthographic projection of a gap (the pixel definition layer 112) of the light-emitting elements 111 on the base (the bottom plate 140 therein). Thus, light emitted by the light-emitting element 111 can be emitted from an opening 12 defined by the electrode strip 11.

For instance, in the substrate provided by at least one embodiment of the present disclosure, the color filter layer includes a plurality of color filters; the plurality of color filters include at least two colors and are in one-to-one correspondence with the plurality of light-emitting elements; and the substrate further comprises: a black matrix which is disposed between the plurality of light-emitting elements. Illustratively, as shown in FIG. 4B, the color filter layer includes a plurality of color filters, e.g., a plurality of first color filters 231, a plurality of second color filters 232 and a plurality of third color filters 233; and the first color filter 231, the second color filter 232 and the third color filter 233 have different colors, for example, may be respectively red, green, blue, etc. The color filters are in one-to-one correspondence with the light-emitting elements. Thus, when the light-emitting element only emits light of one color (for example, white light, blue light, etc.), the color filter layer may allow the substrate to display a color image; and when the light-emitting elements emit light of a plurality of colors, the color of the color filters may be the same with the color of light emitted by corresponding light-emitting elements. Due to the color filter, when incident external light is reflected out of the substrate, the color of reflected light is the same with the color of the color filter, so as to improve the contrast of a display image.

For instance, in at least one embodiment of the present disclosure, quantum dots may be disposed in the color filter and may generate light of different colors under the excitation of light of specific wavelength (such as blue light).

Figure 5:
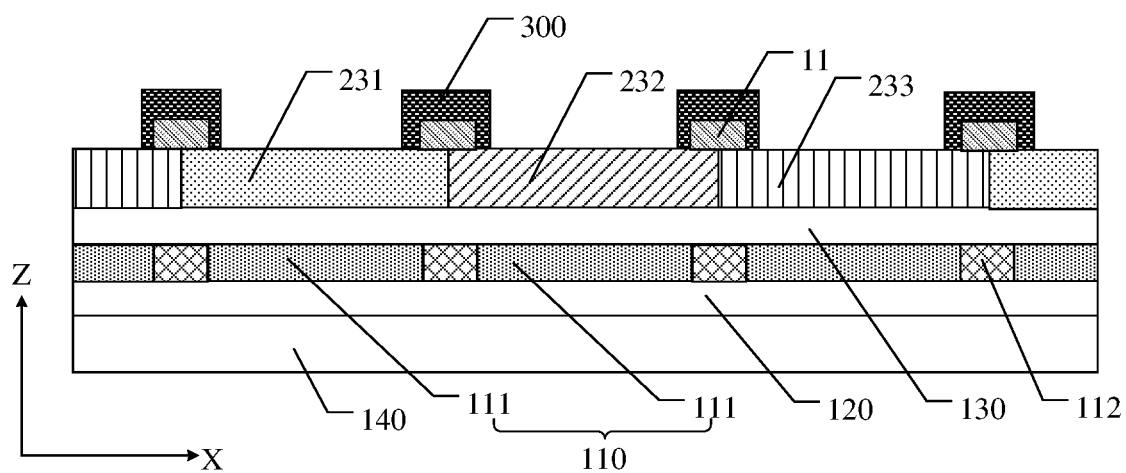
FIG. 5 is a cross-sectional view of a substrate provided by some embodiments of the present disclosure.

For instance, the substrate provided by at least one embodiment of the present disclosure further comprises a black matrix which is disposed between the plurality of light-emitting elements. An orthographic projection of the black matrix on the plane in which the base is located is outside an orthographic projection of the light-emitting element on the plane in which the base is located, that is, inside an orthographic projection of a gap between the light-emitting elements on the plane in which the base is located. Illustratively, as shown in FIG. 5, a black matrix 300 is disposed on a side of the touch structure layer away from the base (the bottom plate 140 therein). It should be noted that FIG. 5 only shows the first electrode layer (the electrode strips 11 of the latticed electrode therein) and the color filter layer (the color filters therein, e.g., the first color filter 231) of the touch structure layer, and does not show the second electrode layer (e.g., the connecting bridge); and the second electrode layer is disposed between the color filter layer and the base. An orthographic projection of the black matrix 300 on the plane in which the base is located (such as the bottom plate 140) is outside an orthographic projection of the light-emitting element 111 on the plane in which the base is located, for example, inside an orthographic projection of the pixel definition layer 112 on the plane in which the base is located, or coincides with or is partially overlapped with the orthographic projection of the pixel definition layer 112 on the plane in which the base is located. For instance, in the Z-axis direction, the black matrix 300 covers the electrode strips 11 of the latticed electrode.

For instance, in the substrate provided by at least one embodiment of the present disclosure, the black matrix is set to make contact with a surface of the latticed electrode away from the base. Illustratively, as shown in FIG. 5, the black matrix 300 is disposed on a surface of the electrode strip 11 away from the base (such as the bottom plate 140 therein). The black matrix may be used for dividing a pixel region, so as to improve the contract of the display image, so the black matrix is usually disposed on a side of the color filter layer facing the outside, that is, the color filter layer is disposed between the black matrix and the light-emitting element. In the embodiment of the present disclosure, as the black matrix layer is disposed in the touch structure layer, the black matrix may be disposed on a surface of the touch structure layer (such as the electrode strips of the latticed electrode) away from the base, so there are no interval between the black matrix and the electrode strip, and the black matrix can shield light obliquely irradiated to the electrode strip, thereby preventing the reflection of external light (including oblique external light) by the latticed electrode and improving the contrast of the display image.

For instance, the black matrix may cover surfaces of the electrode strip of the latticed electrode except a surface facing the base, that is, disposed on a surface of the electrode strip of the latticed electrode away from the base and on a side surface connected with the surface, thereby better shielding light obliquely irradiated to the electrode strip, preventing the reflection of external light (including oblique external light) by the latticed electrode, and improving the contrast of the display image.

Alternatively, the black matrix may also be only disposed on a surface of the touch structure layer (e.g., the electrode strip of the latticed electrode) away from the base, and two side surfaces thereof are aligned with the side surfaces of the electrode strip.

For instance, in the substrate provided by at least one embodiment of the present disclosure, as shown in FIG. 5, the base may also include a driving circuit layer 120 which is disposed between the display array layer 110 and the bottom plate 140. For instance, the driving circuit layer may include a pixel driving circuit which may be a passive-matrix organic light-emitting diode (PMOLED) driving circuit or an active-matrix organic light-emitting diode (AMOLED) driving circuit. For instance, the AMOLED driving circuit may include a driving transistor, a data writing transistor and a storage capacitor, namely a 2T1C circuit structure, in which T indicates a switching element such as a thin-film transistor (TFT) and C indicates a storage capacitor. The AMOLED driving circuit may also be a 4T1C circuit structure, a 4T2C circuit structure or other circuit structures as required, so as to have compensation function, reset function, light-emitting control function, etc. The type and the specific composition of the driving circuit layer are not limited in the embodiment of the present disclosure.

For instance, in the substrate provided by at least one embodiment of the present disclosure, the base may also include an encapsulation layer 130 which is disposed between the touch structure layer (such as the color filter layer 200 therein) and the display array layer 110. For instance, after forming the encapsulation layer 130, the touch structure layer may be formed by directly performing processes such as film deposition and patterning on the encapsulation layer 130, so as to increase the bonding intensity of the overall structure of the substrate and be favorable for the light and thin design of the substrate.

For instance, in the substrate provided by at least one embodiment of the present disclosure, the encapsulation layer may be a single-layer structure and may also be a composite structure of at least two layers. For instance, the material of the encapsulation layer may include an insulating material such as silicon nitride, silicon oxide, silicon oxynitride and polymer resin. For instance, the encapsulation layer may include a first inorganic encapsulation layer, an organic encapsulation layer and a second inorganic encapsulation layer which are sequentially disposed on the display array layer. For instance, the materials of the first inorganic encapsulation layer and the second inorganic encapsulation layer may include inorganic materials such as silicon nitride, silicon oxide and silicon oxynitride, and the inorganic materials have high density and can prevent the intrusion of water, oxygen, etc. For instance, the material of the organic encapsulation layer may be a polymer material containing desiccant or a polymer material that can block moisture, e.g., polymer resin, so as to planarize a surface of the display substrate and release the stress of the first inorganic encapsulation layer and the second inorganic encapsulation layer, and may also include a water-absorbing material such as desiccant to absorb water, oxygen and other substances that invade inside.

It should be noted that in the case of insufficient thickness of the encapsulation layer (such as the second inorganic encapsulation layer), a buffer layer may be formed on the encapsulation layer to avoid the damage to the encapsulation layer in the process of forming the touch structure layer. For instance, the materials of the buffer layer may include silicon oxide, silicon nitride, silicon oxynitride, etc.

Figure 6:
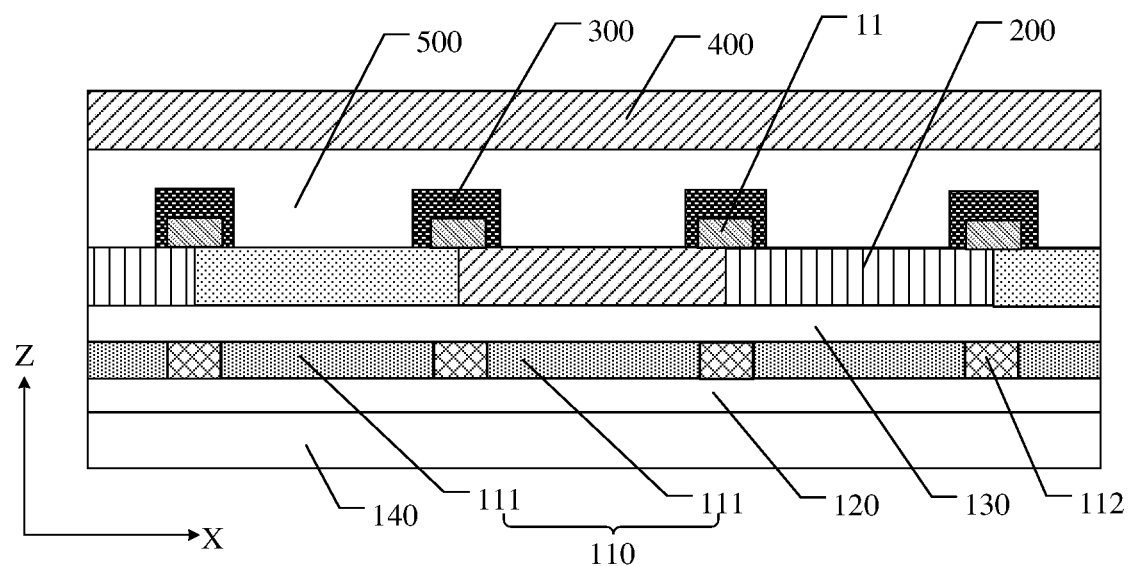
FIG. 6 is a cross-sectional view of a substrate provided by some embodiments of the present disclosure.

For instance, in at least one embodiment of the present disclosure, as shown in FIG. 6, the substrate may also comprise a cover plate 400 and an optically clear adhesive (OCA) layer 500. The cover plate 400 is disposed on a side of the touch structure layer (e.g., the color filter layer 200 therein) away from the base (e.g., the bottom plate 140 therein), and the optically clear adhesive layer 500 is disposed between the cover plate 400 and the touch structure layer. The cover plate 400 may be configured to protect components such as the touch structure layer in the substrate. For instance, the cover plate 400 may be a flexible material.

For instance, in at least one embodiment of the present disclosure, the material of the cover plate may include an organic material. For instance, the organic material may be polyimide, polycarbonate, polyacrylate, polyetherimide, polyethersulfone, polyethylene terephthalate, polyethylene naphthalate and other resin material.

For instance, the substrate provided by at least one embodiment of the present disclosure may be a liquid crystal display array substrate; the color filter layer includes a plurality of color filters; the substrate comprises a plurality of pixel units defined by data lines and gate lines intersected with each other; the substrate further comprises a black matrix; a region between the pixel units correspond to the black matrix; and the black matrix is disposed between the plurality of color filters. The case that the black matrix is disposed between the plurality of color filters may be that a projection of the black matrix on the base is between projections of the plurality of color filters on the substrate. At this point, the projections of the color filters may be connected with each other, and the projection of the black matrix corresponds to a junction between the color filters and is overlapped with projections of two adjacent color filters; or the projections of the color filters are not connected with each other, and the projection of the black matrix is located between the projections of the color filters; or the black matrix and the plurality of color filters are in the same plane and the black matrix is disposed between the plurality of color filters. No limitation will be given here in the embodiment of the present disclosure. The settings and the positional relationships of the remaining components are the same with those described above, so no further description will be given here.

At least one embodiment of the present disclosure provides a display device, which comprises the substrate provided by any foregoing embodiment. For instance, the display device comprises a flexible circuit board, and a control chip is disposed on the flexible circuit board. For instance, the control chip may be a central processing unit (CPU), a digital signal processor (DSP), a system chip (SoC), etc. For instance, the control chip may also include a memory and may also include a power module and the like, and realizes power supply and signal input and output function through wires, signal lines and the like that are additionally arranged. For instance, the control chip may also include a hardware circuit, computer executable codes, etc. The hardware circuit may include the conventional very large scale integration (VLSI) circuit or gate array and the existing semiconductor such as a logic chip or a transistor or other discrete components. The hardware circuit may also include a field programmable gate array (FPGA), programmable array logic, a programmable logic device, etc.

For instance, in at least one embodiment of the present disclosure, the display device may be a product or a component having display function such as a TV, a digital camera, a mobile phone, a watch, a table PC, a notebook computer or a navigator.

It should be noted that for clarity, not all the structures of the display device are described here. In order to realize necessary functions of the display device, other structures may be set by those skilled in the art according to specific application scenes. No limitation will be given here in the present disclosure.

At least one embodiment of the present disclosure provides a method for manufacturing a substrate, which comprises: providing a base; and forming a touch structure layer, including: forming the touch structure layer on the base, in which the touch structure layer includes a laminated layer of a first electrode layer, a color filter layer and a second electrode layer, and the color filter layer is disposed between the first electrode layer and the second electrode layer. For instance, the color filter layer is formed as an insulating layer. In the substrate obtained by utilization of the above manufacturing method, the color filter layer is formed in the touch structure layer and acts as an insulating layer among the first electrode layer, the color filter layer and the second electrode layer, so no color filter layer is required to be additionally formed outside the touch structure layer, thereby simplifying the structure of the substrate, simplifying the manufacturing process of the substrate, being favorable for the light and thin design of the substrate, and improving the touch sensitivity.

For instance, in the method for manufacturing the substrate provided by at least one embodiment of the present disclosure, the forming the touch structure layer includes: depositing a first conductive material film on the base, performing a patterning process on the first conductive material film, and forming the first electrode layer including a plurality of first strip-shaped electrodes arranged side by side; depositing an insulating material that cover the first electrode layer on the first electrode layer to form the color filter layer; and depositing a second conductive material film on the base, performing a patterning process on the second conductive material film, and forming the second electrode layer including a plurality of second strip-shaped electrodes arranged side by side. For instance, the first strip-shaped electrodes and the second strip-shaped electrodes are intersected with each other. One of the first strip-shaped electrode and the second strip-shaped electrode is formed as a driving electrode, and the other one of the first strip-shaped electrode and the second strip-shaped electrode is formed as a sensing electrode. The structure of the touch structure layer of the substrate obtained by utilization of the method may refer to relevant description in the embodiment as shown in FIGS. 2A and 2B. No further description will be given here.

For instance, in the method for manufacturing the substrate provided by at least one embodiment of the present disclosure, the forming the touch structure layer includes: depositing a second conductive material film on the base, performing a patterning process on the second conductive material film, and forming the second electrode layer including a plurality of connecting bridges; depositing an insulating material that cover the second electrode layer on the second electrode layer to form the color filter layer, performing a patterning process on the color filter layer to form a plurality of openings to expose a portion of the connecting bridge; and depositing a first conductive material film on the base, performing a patterning process on the first conductive material film to form the first electrode layer including a plurality of first strip-shaped electrodes arranged side by side and a plurality of second strip-shaped electrodes arranged side by side, in which the first strip-shaped electrodes and the second strip-shaped electrodes are intersected with each other; the first strip-shaped electrode is disconnected at an intersection with the second strip-shaped electrode; and a portions of the first strip-shaped electrode that are disconnected at the intersection with the second strip-shaped electrode are connected with each other through the connecting bridge. The structure of the touch structure layer of the substrate obtained by utilization of the method may refer to relevant description in the embodiment as shown in FIGS. 3A and 3B. No further description will be given here.

For instance, in the method for manufacturing the substrate provided by at least one embodiment of the present disclosure, the color filter layer is configured to include a plurality of color filters of at least two colors; the base is configured to include a display array layer provided with a plurality of light-emitting elements; and the forming the touch structure layer also includes: performing a patterning process on at least one of the first conductive layer and the second conductive layer, so that at least one of the first conductive layer and the second conductive layer is formed as a latticed electrode, the latticed electrode includes a plurality of electrode strips; the plurality of electrode strips are intersected with each other to form a plurality of openings; an orthographic projection of the opening on the plane in which the base is located coincides with an orthographic projection of the light-emitting element on the plane in which the base is located; and an orthographic projection of the electrode strip on the plane in which the base is located is within an orthographic projection of a gap of the light-emitting elements on the plane in which the base is located. In the substrate obtained by utilization of the above manufacturing method, the latticed electrode has less reflection of external light, thereby reducing the reflection of external light by the touch structure layer and improving the contrast of the display image.

For instance, the method for manufacturing the substrate provided by at least one embodiment of the present disclosure further comprises: forming a black matrix on a surface of the touch structure layer away from the base, wherein an orthographic projection of the black matrix on the plane in which the base is located is within an orthographic projection of a gap of the light-emitting elements on the plane in which the base is located. In the substrate obtained by utilization of the manufacturing method, there are no interval between the black matrix and the electrode strip, and the black matrix can shield light obliquely irradiated to the electrode strip, so as to eliminate the reflection of external light by the latticed electrode and improve the contrast of the display image.

Description will be given below to the method for manufacturing the substrate in one example of the embodiment of the present disclosure as shown in FIGS. 7A-7D by taking the method for manufacturing the substrate as shown in FIG. 3C as an example.

Figure 7A:
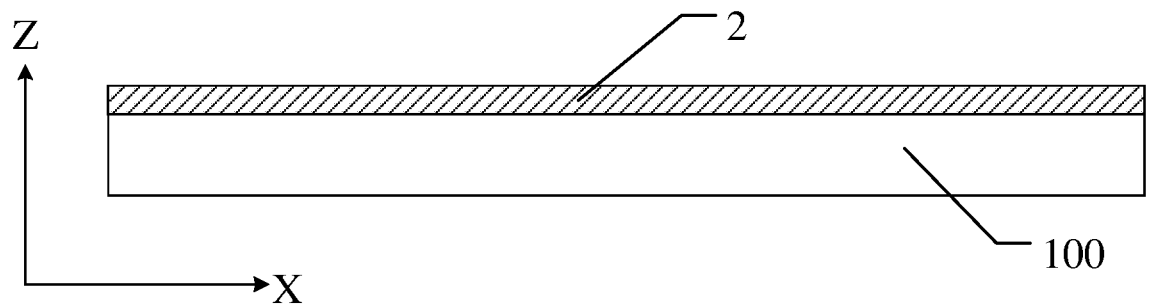
FIGS. 7A to 7E are flowcharts of a method for manufacturing a substrate provided by some embodiments of the present disclosure.

As shown in FIG. 7A, a base 100 is provided and a second conductive material film 2 is deposited on the base.

For instance, the base 100 may be only a bottom plate used for supporting and may also include a display array layer 110, a driving circuit layer 120, an encapsulation layer 130 and the like as shown in FIG. 4B. The manufacturing processes of the display array layer 110, the driving circuit layer 120 and the encapsulation layer 130 may refer to the conventional processes, and no further description will be given here.

For instance, in the embodiment of the present disclosure, the bottom plate may be a glass plate, a quartz plate, a metal plate, a resin plate, etc. For instance, the material of the bottom plate may include an organic material. For instance, the organic material may be a resin material such as polyimide, polycarbonate, polyacrylate, polyetherimide, polyethersulfone, polyethylene terephthalate and polyethylene naphthalate.

Figure 7B:
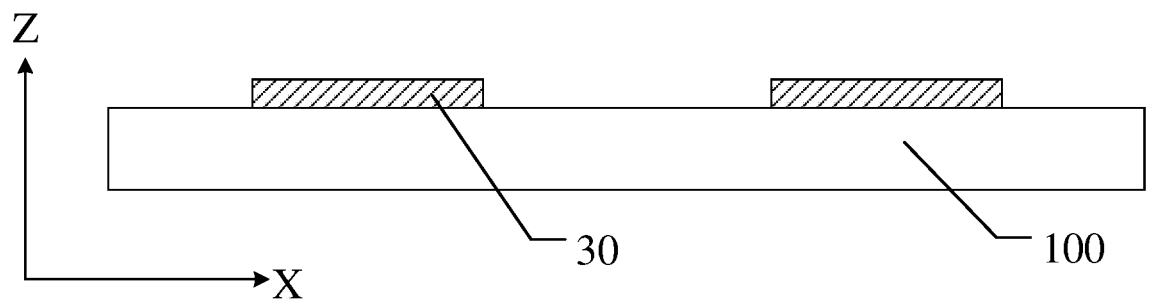

As shown in FIGS. 7A and 7B, the second conductive material film 2 is subjected to a patterning process to form the second electrode layer including a plurality of connecting bridges 30. The distribution of the connecting bridges 30 in the substrate may refer to relevant description in the embodiment as shown in FIGS. 3A and 3B. For instance, the connecting bridge 30 may be formed as the latticed electrode as shown in FIG. 4A.

Figure 7C:
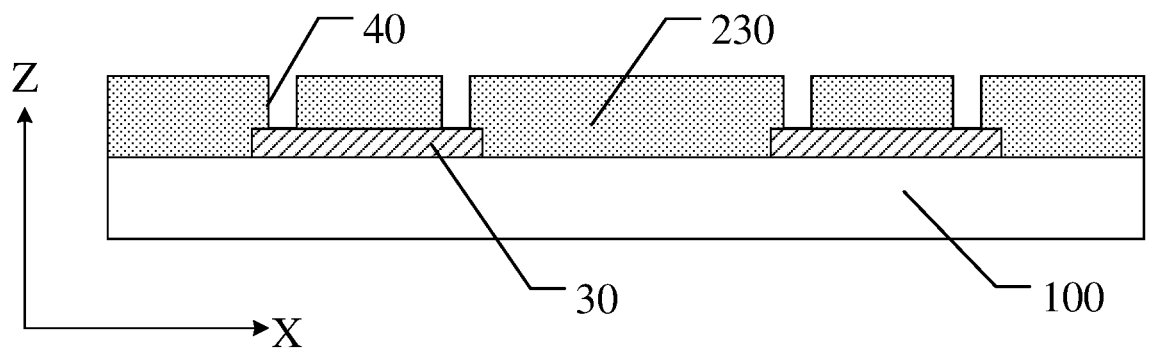

As shown in FIGS. 7B and 7C, a color filter layer 230 is formed on the base 100 on which the connecting bridge 30 is formed, and the color filter layer 230 is subjected to a patterning process to form a through hole 40 that expose the connecting bridge 30. In the process, the color filter layer 230 planarizes a surface of the substrate. The structure of the color filter layer 230 may refer to relevant description in the embodiment as shown in FIG. 4B. No further description will be given here.

For instance, in some embodiments of the present disclosure, films of different colors may be respectively deposited on the base, and the films of different colors are respectively subjected to patterning process to form color filters of different colors. For instance, in some embodiments of the present disclosure, a film may be deposited on the base, and different types of quantum dots are injected into different regions of the film, so that different regions may formed as color filters of different colors which can be excited to emit different colors.

Figure 7D:
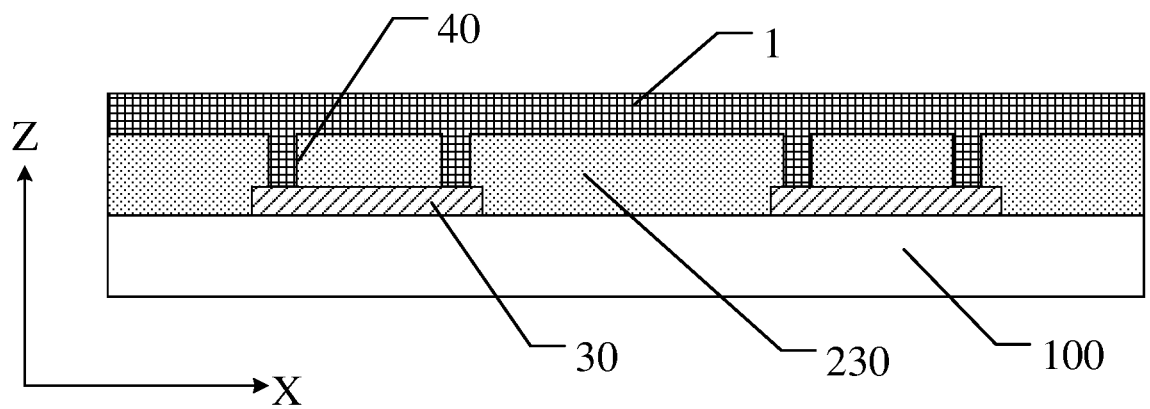

As shown in FIGS. 7C and 7D, a first conductive material layer 1 is deposited on the color filter layer 230 and connected with the connecting bridge 30 through the through hole 40.

Figure 7E:
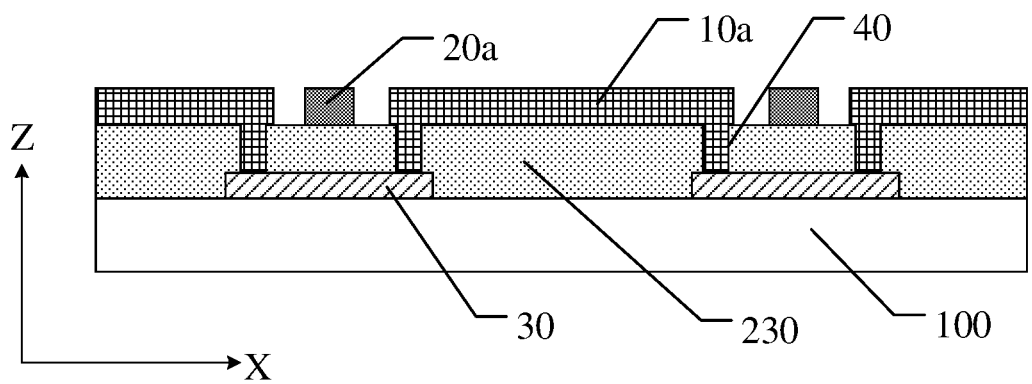

As shown in FIGS. 7E and 3C, the first conductive material layer 1 is subjected to a patterning process to form a plurality of first strip-shaped electrodes 10a and a plurality of second strip-shaped electrodes 20a. The arrangement mode of the first strip-shaped electrodes 10a and the second strip-shaped electrodes 20a may refer to relevant description in the embodiment as shown in FIGS. 3A and 3B, so no further description will be given here. For instance, the first strip-shaped electrode 10a and the second strip-shaped electrode 20a may be formed as the latticed electrode as shown in FIG. 4A.

Illustratively, the case that the first strip-shaped electrode 10a and the second strip-shaped electrode 20a are formed as the latticed electrode may be that all portions of the strip-shaped electrode are formed to be latticed, or at least one portion of the strip-shaped electrode is formed to be latticed. For instance, as shown in FIG. 3B, the first sub-electrode 101 and the second sub-electrode 102 are formed to be latticed; the third sub-electrode 201 and the fourth sub-electrode 202 are formed to be latticed; a connecting bridge between the first sub-electrode 101 and the second sub-electrode 102 is also formed to be latticed; and a connecting part between the third sub-electrode 201 and the fourth sub-electrode 102 is also formed to be latticed.

In embodiments of the present disclosure, the substrate, the manufacturing method thereof and the display device are provided. The substrate comprises the base and the touch structure layer including the first electrode layer, the color filter layer and the second electrode layer which are stacked on the base, wherein the color filter layer is disposed between the first electrode layer and the second electrode layer. In the substrate, the color filter layer is disposed in the touch structure layer and acts as the insulating layer among the first electrode layer, the color filter layer and the second electrode layer, so no color filter layer is required to be additionally formed outside the touch structure layer, thereby simplifying the structure of the substrate, simplifying the manufacturing process of the substrate, and being favorable for the light and thin design of the substrate.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged or reduced, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

This application claims priority to Chinese Patent Application No. 201910759083.5 filed Aug. 16, 2019, the disclosure of which is incorporated herein by reference as part of the application.

The invention claimed is:

1. A substrate, comprising:
   a base;
   a touch structure layer, disposed on the base and including a first electrode layer, a color filter layer and a second electrode layer, the first electrode layer, the color filter layer and the second electrode layer being laminated to each other; and
   a black matrix,
   wherein the color filter layer includes a plurality of color filters, the color filter layer is disposed between the first electrode layer and the second electrode layer,
   wherein the base includes a display array layer, the display array layer includes a plurality of light-emitting elements,
   the touch structure layer includes a plurality of sub-touch regions, and a portion of at least one of the first electrode layer and the second electrode layer disposed in the plurality of sub-touch regions is set to be a latticed electrode,
   the latticed electrode includes a plurality of electrode strips, the plurality of electrode strips are intersected with each other to form a plurality of openings in one-to-one correspondence with the plurality of light-emitting elements,
   wherein the black matrix is configured to make contact with a surface of each of the plurality of electrode strips of the latticed electrode, the surface is away from the base,
   an orthographic projection of the black matrix on a plane is outside an orthographic projection of each of the plurality of light-emitting elements on the plane, the base is located in the plane,
   wherein a projection of the black matrix corresponds to a junction between the color filters and is overlapped with projections of two adjacent color filters,
   wherein the black matrix is disposed on the surface away from the base of each of the plurality of electrode strips of the latticed electrode and on side surfaces connected with the surface; and the latticed electrode is an opaque electrode.

2. The substrate according to claim 1, wherein
   one of the first electrode layer and the second electrode layer includes a plurality of first strip-shaped electrodes arranged side by side, another one of the first electrode layer and the second electrode layer includes a plurality of second strip-shaped electrodes arranged side by side; and
   the plurality of first strip-shaped electrodes and the plurality of second strip-shaped electrodes are intersected with each other.

3. The substrate according to claim 1, wherein
   the first electrode layer includes a plurality of first strip-shaped electrodes arranged side by side and a plurality of second strip-shaped electrodes arranged side by side, the plurality of first strip-shaped electrodes and the plurality of second strip-shaped electrodes are intersected with each other, and each of the plurality of first strip-shaped electrodes is disconnected at intersections with the plurality of second strip-shaped electrodes;
   the second electrode layer includes a plurality of connecting bridges, and portions of each of the plurality of first strip-shaped electrodes that are disconnected at the intersections with the plurality of second strip-shaped electrodes are connected with each other through one of the plurality of connecting bridges.

4. The substrate according to claim 3, wherein
   a through hole is formed in the color filter layer, and each of the plurality of connecting bridges is connected with the first strip-shaped electrode through the through hole.

5. The substrate according to claim 3, wherein
   the second electrode layer is disposed between the base and the color filter layer.

6. The substrate according to claim 1, wherein
   the plurality of color filters include at least two colors and are in one-to-one correspondence with the plurality of light-emitting elements.

7. The substrate according to claim 1, wherein an orthographic projection of each of the plurality of electrode strips on a plane in which the base is located is outside an orthographic projection of each of the plurality of light-emitting elements on the plane in which the base is located.

8. A display device, comprising the substrate according to claim 1.

9. A method for manufacturing a substrate, comprising:
   providing a base; and
   forming a touch structure layer, including:
     forming the touch structure layer on the base,
     forming a black matrix on a surface of the touch structure layer away from the base,
   wherein the touch structure layer includes a laminated layer of a first electrode layer, a color filter layer and a second electrode layer, and
   the color filter layer is formed between the first electrode layer and the second electrode layer,
   wherein the color filter layer is formed to include a plurality of color filters of at least two colors, and the base is formed to include a display array layer including a plurality of light-emitting elements, and the forming the touch structure layer also includes:
   performing a patterning process on at least one of the first electrode layer and the second electrode layer, so that at least one of the first conductive layer and the second conductive layer is formed to be a latticed electrode, the latticed electrode includes a plurality of electrode strips, the plurality of electrode strips are intersected with each other to form a plurality of openings;
   wherein an orthographic projection of each of the plurality of openings on a plane coincides with an orthographic projection of each of the plurality of light-emitting elements on the plane, the base is located in the plane,
   and orthographic projections of the plurality of electrode strips on the plane are located within orthographic projections of gaps of the plurality of light-emitting elements on the plane,
   a projection of the black matrix corresponds to a junction between the color filters and is overlapped with projections of two adjacent color filters,
   wherein an orthographic projection of the black matrix on the plane is located within the orthographic projections of the gaps of the plurality of light-emitting elements on the plane,
   wherein the black matrix is disposed on a surface away from the base of each of the plurality of electrode strips of the latticed electrode and on side surfaces connected with the surface; and the latticed electrode is an opaque electrode.

10. The manufacturing method according to claim 9, wherein the forming the touch structure layer includes:
    depositing a first conductive material film on the base, performing a patterning process on the first conductive material film to form the first electrode layer including a plurality of first strip-shaped electrodes arranged side by side;

depositing an insulating material that covers the first electrode layer on the first electrode layer to form the color filter layer; and depositing a second conductive material film on the base, performing a patterning process on the second conductive material film to form the second electrode layer including a plurality of second strip-shaped electrodes arranged side by side, wherein the plurality of first strip-shaped electrodes and the plurality of second strip-shaped electrodes are intersected with each other.

11. The manufacturing method according to claim 9, wherein the forming the touch structure layer includes:

depositing a second conductive material film on the base, performing a patterning process on the second conductive material film to form the second electrode layer including a plurality of connecting bridges;

depositing an insulating material that covers the second electrode layer on the second electrode layer to form the color filter layer, and performing a patterning process on the color filter layer to form a plurality of openings exposing a portion of each of the plurality of, connecting bridges; and depositing a first conductive material film on the base, performing a patterning process on the first conductive material film to form the first electrode layer including a plurality of first strip-shaped electrodes arranged side by side and a plurality of second strip-shaped electrodes arranged side by side, wherein the plurality of first strip-shaped electrodes and the plurality of second strip-shaped electrodes are intersected with each other, each of the plurality of first strip-shaped electrodes is disconnected at intersections with the second strip-shaped electrodes; and portions of each of the plurality of first strip-shaped electrodes that are disconnected at the intersections with the second strip-shaped electrodes are connected with each other through one of the plurality of connecting bridges.

12. A substrate, comprising:

a base;

a touch structure layer, disposed on the base and including a first electrode layer, a color filter layer and a second electrode layer, the first electrode layer, the color filter layer and the second electrode layer being laminated to each other; and a black matrix, wherein the color filter layer includes a plurality of color filters, the color filter layer is disposed between the first electrode layer and the second electrode layer, wherein the base includes a display array layer, the display array layer includes a plurality of light-emitting elements, the touch structure layer includes a plurality of sub-touch regions, and a portion of at least one of the first electrode layer and the second electrode layer disposed in the plurality of sub-touch regions is set to be a latticed electrode, the latticed electrode includes a plurality of electrode strips, the plurality of electrode strips are intersected with each other to form a plurality of openings in one-to-one correspondence with the plurality of light-emitting elements, wherein the black matrix is configured to make contact with a surface of each of the plurality of electrode strips of the latticed electrode, the surface is away from the base, an orthographic projection of the black matrix on a plane is outside an orthographic projection of each of the plurality of light-emitting elements on the plane, the base is located in the plane wherein a projection of the black matrix corresponds to a junction between the color filters and is overlapped with projections of two adjacent color filters, wherein two side surfaces of the black matrix are aligned with side surfaces of the electrode strip contacting the black matrix.

13. The substrate according to claim 12, wherein one of the first electrode layer and the second electrode layer includes a plurality of first strip-shaped electrodes arranged side by side, another one of the first electrode layer and the second electrode layer includes a plurality of second strip-shaped electrodes arranged side by side; and the plurality of first strip-shaped electrodes and the plurality of second strip-shaped electrodes are intersected with each other.

14. The substrate according to claim 12, wherein the first electrode layer includes a plurality of first strip-shaped electrodes arranged side by side and a plurality of second strip-shaped electrodes arranged side by side, the plurality of first strip-shaped electrodes and the plurality of second strip-shaped electrodes are intersected with each other, and each of the plurality of first strip-shaped electrodes is disconnected at intersections with the plurality of second strip-shaped electrodes;

the second electrode layer includes a plurality of connecting bridges, and portions of each of the plurality of first strip-shaped electrodes that are disconnected at the intersections with the plurality of second strip-shaped electrodes are connected with each other through one of the plurality of the connecting bridges.

15. The substrate according to claim 14, wherein a through hole is formed in the color filter layer, and each of the plurality of connecting bridges is connected with one of the plurality of first strip-shaped electrodes through the through hole.

16. The substrate according to claim 14, wherein the second electrode layer is disposed between the base and the color filter layer.

17. The substrate according to claim 12, wherein the plurality of color filters include at least two colors and are in one-to-one correspondence with the plurality of light-emitting elements.

18. The substrate according to claim 12, wherein an orthographic projection of each of the plurality of electrode strips on a plane in which the base is located is outside an orthographic projection of each of the plurality of light-emitting elements on the plane in which the base is located.

* * * * *